United States Patent
Lee et al.

(10) Patent No.: US 8,841,184 B2
(45) Date of Patent: Sep. 23, 2014

(54) DIELECTRIC LAYER FOR SEMICONDUCTOR DEVICE AND METHOD OF MANUFACTURING THE SAME

(71) Applicants: Jong-Ho Lee, Youngin (KR); Nae-In Lee, Seoul (KR)

(72) Inventors: Jong-Ho Lee, Youngin (KR); Nae-In Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/661,748

(22) Filed: Oct. 26, 2012

(65) Prior Publication Data

US 2013/0084713 A1 Apr. 4, 2013

Related U.S. Application Data

(60) Division of application No. 13/039,811, filed on Mar. 3, 2011, now Pat. No. 8,314,465, which is a division of application No. 12/098,373, filed on Apr. 4, 2008, now Pat. No. 7,902,019, which is a division of application No. 11/027,256, filed on Dec. 30, 2004, now Pat. No. 7,371,633, which is a continuation-in-part of application No. 09/776,059, filed on Feb. 2, 2001, now Pat. No. 6,844,604.

(30) Foreign Application Priority Data

Jan. 29, 2004 (KR) .............................. 2004-0005817

(51) Int. Cl.
*H01L 21/8238* (2006.01)
*H01L 29/788* (2006.01)
*H01L 21/02* (2006.01)
*H01L 29/51* (2006.01)
*H01L 21/28* (2006.01)
*H01L 29/94* (2006.01)
*H01L 49/02* (2006.01)

(52) U.S. Cl.
CPC ...... *H01L 21/02175* (2013.01); *H01L 29/7881* (2013.01); *H01L 21/02192* (2013.01); *H01L 29/513* (2013.01); *H01L 21/02178* (2013.01); *H01L 29/517* (2013.01); *H01L 21/28185* (2013.01); *H01L 21/28194* (2013.01); *H01L 29/94* (2013.01); *H01L 29/518* (2013.01); *H01L 21/28202* (2013.01); *H01L 21/02181* (2013.01); *H01L 28/56* (2013.01)
USPC ..... 438/216; 438/257; 438/591; 257/E21.625

(58) Field of Classification Search
CPC ................... H01L 21/28185; H01L 21/28194; H01L 29/7843
USPC ........... 438/216, 591, 287, 785; 257/E21.179
See application file for complete search history.

(56) References Cited

U.S. PATENT DOCUMENTS

| | | | | |
|---|---|---|---|---|
| 6,645,882 B1 * | 11/2003 | Halliyal et al. | | 438/785 |
| 2002/0146895 A1 * | 10/2002 | Ramdani et al. | | 438/497 |
| 2004/0135217 A1 * | 7/2004 | Yamamoto | | 257/410 |

* cited by examiner

*Primary Examiner* — Thanhha Pham
(74) *Attorney, Agent, or Firm* — F. Chau & Associates, LLC

(57) ABSTRACT

A semiconductor device comprises a silicate interface layer and a high-k dielectric layer overlying the silicate interface layer. The high-k dielectric layer comprises metal alloy oxides.

12 Claims, 4 Drawing Sheets

DIELECTRIC LAYER FOR SEMICONDUCTOR DEVICE AND METHOD OF MANUFACTURING THE SAME

CROSS-REFERENCE TO RELATED APPLICATIONS

This application is a Continuation Application of U.S. patent application Ser. No. 13/039,811 filed on Mar. 3, 2011, which is a Divisional Application of U.S. patent application Ser. No. 12/098,373 filed on Apr. 4, 2008, now U.S. Pat. No. 7,902,019, which is a divisional of U.S. patent application Ser. No. 11/027,256 filed on Dec. 30, 2004, now U.S. Pat. No. 7,371,633, and which claims priority to Korean Patent Application No. 10-2004-5817 filed Jan. 29, 2004 which is a Continuation-In-Part of U.S. patent application Ser. No. 09/776,059 filed on Feb. 2, 2001, now U.S. Pat. No. 6,844,604, the disclosures of which are hereby incorporated herein by reference in their entireties.

FIELD OF THE INVENTION

This invention relates generally to the field of semiconductor devices, and more particularly, to a multi-layer dielectric structure and semiconductor devices employing the multi-layer dielectric structure and a method of manufacturing the same.

DESCRIPTION OF THE RELATED ART

With each generation of metal oxide semiconductor (MOS) integrated circuit (IC), the device dimensions have been continuously scaled down to provide for high-density and high-performance devices. Particularly, the thickness of gate dielectrics is made as small as possible because the drive current in a MOS field effect transistor (FET) increases with decreasing gate dielectric thickness. Thus, it has become increasingly important to provide extremely thin, reliable, and low-defect gate dielectrics for improving device performance.

For decades, a thermal oxide layer, e.g., silicon dioxide ($SiO_2$), has been used as the gate dielectrics because the silicon dioxide thermal oxide layer is stable with the underlying silicon substrate and the fabrication process is relatively simple.

However, because the silicon dioxide has a low dielectric constant (k), e.g., 3.9, further scaling down of silicon dioxide gate dielectric has become more and more difficult. For example, if the thickness of the silicon dioxide gate dielectric is less than 40 angstroms, direct tunneling may occur. As a result, a gate-to-channel leakage current through thin silicon dioxide gate dielectrics increases, leading to an undesirable power consumption problem.

These problems lead to consideration of alternative dielectric materials that can be formed in a thicker layer than silicon dioxide but still produce the same or better device performance. The performance can be expressed as "equivalent oxide thickness (EOT)."

Various attempts have been made to improve the device characteristics of the dielectric materials. For example, U.S. Pat. No. 6,020,024 discloses an oxynitride layer interposed between a silicon substrate and a high-k dielectric layer. U.S. Pat. No. 6,013,553 discloses a zirconium oxynitride layer or a hafnium oxynitride layer as the gate dielectrics. Further, PCT International Patent Application Publication No. WO 00/01008 discloses $SiO_2$, silicon nitride and oxynitride interface layers. Also, U.S. Pat. No. 6,020,243 discloses a high permittivity zirconium (or hafnium) silicon-oxynitride gate dielectrics.

However, such attempts have not succeeded in solving the problems associated with the conventional dielectric materials. For example, the silicon nitride layer or oxynitride layer between the high-k dielectric layer and the silicon substrate or the polysilicon gate electrode causes charge trapping with high interface state densities, thereby reducing channel mobility and also degrading device performance. Further, the formation of the silicon nitride layer or the oxynitride layer requires a relatively large thermal budget.

Accordingly, a need still remains for an improved dielectric layer structure and the manufacturing method to improve the device performance by, for example, reducing the equivalent oxide thickness of the dielectric layer as well as improvement of the interface characteristics.

SUMMARY OF THE INVENTION

In one embodiment, a semiconductor device comprises a silicate interface layer and a high-k dielectric layer overlying the silicate interface layer. The high-k dielectric layer comprises metal alloy oxides.

DETAILED DESCRIPTION OF THE PREFERRED EMBODIMENTS

The present invention provides a noble dielectric layer structure and a method of manufacturing the same. In the following description, numerous specific details are set forth to provide a thorough understanding of the present invention. However, one having ordinary skill in the art should recognize that the invention can be practiced without these specific details. In some instances, well-known process steps, device structures, and techniques have not been shown in detail to avoid obscuring the present invention.

Figure 1:
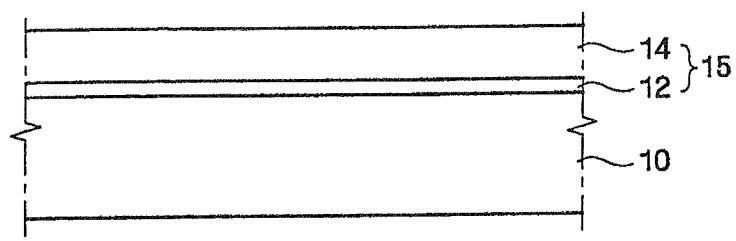
FIG. 1 is a cross-sectional view of a semiconductor device illustrating one embodiment according to the present invention.

Referring to FIG. 1, according to an embodiment of the present invention, a silicate interface layer 12 formed of a silicate material may be disposed on a conductive layer or semiconductor substrate 10 such as a silicon substrate. The dielectric constant of the silicate interface layer 12 is preferably greater than any one of silicon oxide, silicon nitride or silicon oxynitride. Preferably, the silicate interface layer 12 has a thickness of approximately 5-50 angstroms. More preferably, the silicate interface layer 12 has a thickness of approximately 5-10 angstroms (EOT of 2-4 angstroms). The silicate interface layer 12 is preferably formed of a metal silicate material represented by a formula of $M_{1-x}Si_xO_2$. Here, the metal "M" can be hafnium (Hf), zirconium (Zr), tantalum (Ta), titanium (Ti), Scandium (Sc), Yttrium (Y), lanthanum (La), and aluminum (Al). However, this list is not intended to be exhaustive or to limit the invention. Any other metal suitable for the present invention can be used within the sprit and scope of the present invention.

According to one aspect of the present invention, the metal silicate materials ($M_{1-x}Si_xO_2$) show the optimum value of dielectric constant when the value "1×x" is greater than or equal to approximately 0.1. Preferably, the value "1−x" is not greater than approximately 0.5. More preferably, the value "1−x" is approximately 0.2 to approximately 0.4.

Further, a high-k dielectric layer 14 is disposed on the silicate interface layer 12 to form a multi-layer dielectric structure 15. The high-k dielectric layer 14 has a dielectric constant higher than that of $SiO_2$. Preferably, the high-k dielectric layer 14 has a dielectric constant greater than that of the silicate interface layer 12. Also, it is preferred that the high-k dielectric layer have excellent coherency with the underlying silicate interface layer 12 and does not react with the overlying structure such as a gate electrode or a control gate.

In the present invention, the silicate interface layer 12 substantially improves interface characteristics. This is because the silicate interface layer 12 substantially prevents the reactions between, for example, the high-k dielectric layer 14 and the underlying semiconductor substrate 10 or between the high-k dielectric layer and the lower electrode for forming a capacitor. In addition, because the silicate interface layer 12 has a formation energy which is more negative than that of silicon dioxide, it is chemically stable on a silicon substrate, thus helping to form a reliable semiconductor device. Thus, it is believed that the present invention reduces the interface trap density in contrast with the prior art methods and has substantially improved interface characteristics.

Further, the EOT can be maintained or reduced compared to such prior art methods because the metal silicate interface layer 12 has a relatively high dielectric constant of approximately 10 to 12.

Additionally, it is believed that the metal silicate interface layer 12 can maintain a substantially amorphous state even under a high temperature of 900° C. during subsequent heat treatments. Thus, fewer grain boundaries are generated in the metal silicate interface layer 12, thereby reducing a leakage current.

Now referring back to the high-k dielectric layer 14, it comprises metal alloy oxides. The metal alloy oxides of the high-k dielectric layer 14 preferably include at least two interdiffused metal elements. The metal alloy oxides of the high-k dielectric layer 14 may be a mixture of at least two metal oxides. More preferably, the at least two metal elements are homogeneously mixed, most preferably, at an atomic level. However, depending on the application, the at least two metal elements may not be homogeneously mixed, but mixed sufficiently to function as a dielectric material within the spirit and scope of the present invention.

According to one aspect of the present invention, the at least two metal oxides that form the high-k dielectric layer 14 may be chosen to have a minimum net fixed charge in the high-k dielectric layer 14, e.g., close to zero. In this connection, the metal oxides may include, but not limited to, hafnium oxide, zirconium oxide, tantalum oxide, aluminum oxide, titanium oxide, yttrium oxide, strontium oxide, scandium oxide, lanthanum oxide, or barium oxide.

In another aspect, the metal alloy oxide may be described as hafnium-aluminum alloy oxide, zirconium-aluminum alloy oxide, tantalum-aluminum alloy oxide, titanium-aluminum alloy oxide, yttrium-aluminum alloy oxide, or hafnium-zirconium-aluminum oxide. However, this list is not intended to be exhaustive or to limit the invention. Any other metal alloy oxide suitable for the present invention can be used within the sprit and scope of the present invention. One skilled in the art will appreciate that metal-aluminum alloy oxide may be expressed as metal-Aluminate, e.g., hafnium-Aluminate (HfAlO).

The high-k dielectric layer 14 including the metal alloy oxides may have a dielectric constant greater than that of the silicate interface layer 12.

In addition, the metal alloy oxides can be represented by a formula of $A_yB_{1-y}O_z$, (0<y<1). Preferably, A is the same or from the same periodic group as M discussed above. In other words, the metal of the silicate interface layer 12 is preferably the same as the metal of the metal alloy oxides (high-k dielectric layer 14). For example, if the multi-layer dielectric structure 15 comprises a hafnium silicate interface layer 12, the high-k dielectric layer 14 may comprise a hafnium-aluminum alloy oxide layer, e.g., a mixture of hafnium oxide and aluminum oxide. Also, if the silicate interface layer 12 comprises a zirconium silicate interface layer 12, the high-k dielectric layer 14 comprises a zirconium-aluminum alloy oxide layer, e.g., a mixture of zirconium oxide and aluminum oxide. As a result, the device characteristics can be improved. For example, the interface characteristics can be improved due to electrical coherency between the silicate interface layer 12 and the overlying high-k dielectric layer 14.

More preferably, A and M are a group IV metal and B is a group XIII metal. For example, A is zirconium or hafnium and B is aluminum.

According to one aspect, "y" may be approximately 0.5 to approximately 0.9 to have a high dielectric constant and high crystallizing temperature.

According to another aspect, a composition ratio of A to B is between approximately 1:1 and approximately 5:1. This is because the higher the content of A, the higher the dielectric constant, but the lower crystallizing temperature, which results in an increase in the leakage current. Ideally, the high-k dielectric layer 14 has a substantially amorphous crystalline structure to reduce a leakage current therethrough. More preferably, the composition ratio of A to B is approximately 2:1 because net fixed charge of the resulting high-k dielectric layer 14 can be close to zero. In this case, A is preferably hafnium or zirconium; and B is preferably aluminum. The high-k dielectric layer 14 may have a thickness of approximately 2-60 angstroms. Here, 2 angstroms is a basic thickness of one atomic layer, and 60 angstroms represents an upper thickness limit that prevents a popping phenomenon during a subsequent annealing process. As is known in the art, hydroxyl radicals trapped in dielectric layers during the formation can pop therefrom upon subsequent annealing, thereby damaging, e.g. leaving a hole in the dielectric layers. If such a popping phenomenon occurs, subsequent processing steps such as gate poly deposition can be significantly inhibited.

Figure 2:
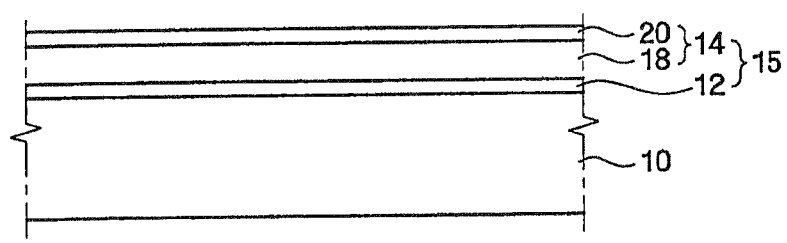
FIG. 2 is a cross-sectional view of a semiconductor device according to another embodiment of the present invention.

FIG. 2 illustrates a method for manufacturing a multi-layer dielectric structure 15 described above for use in a semiconductor device. Details of the manufacturing steps are omitted if they are conventional or well known for clarity and simplicity.

As discussed above, the silicate interface layer 12 may be formed on the conductive layer or semiconductor substrate 10. The metal silicate interface layer 12 is preferably formed of a material as discussed with reference to FIG. 1. More preferably, the metal silicate interface layer 12 may be formed using an ALD technique. Thus, a low thermal budget process is possible with the present invention contrasted with the prior art methods requiring a large thermal budget. Further, by using the ALD technique, a wider range of precursors can be used and a film may be formed having a tightly controlled thickness, which would not have been possible by traditional chemical vapor deposition (CVD).

In particular, as is known in the art, the ALD technique for forming the metal silicate interface layer 12 may be carried out by alternately and repeatedly performing pulsing and purging steps for a metal source, a silicon source, and an oxygen source. In the case of the zirconium silicate interface layer 12, $ZrCl_4$ may be used as the metal source. Similarly, in the case of a hafnium silicate interface layer, $HfCl_4$ may be used as the metal source. Also, the silicon source may comprise $SiH_4$ or $SiCl_4H_2$. The oxygen source may comprise $H_2O$, ozone, oxygen radicals, alcohol such as IPA, $D_2O$, or $H_2O_2$. Also, other precursors suitable for the present invention can be used within the sprit and scope of the present invention. Such exemplary precursors are illustrated in Table 1.

TABLE 1

|  | Hf source | Zr source | Si source |
|---|---|---|---|
| Halide | $HfCl_4$ | $ZrCl_4$ | $SiCl_4$ |
| Alkoxide | $Hf(OtC_4H_9)_4 Hf(OC_2H_5)_4$ | $Zr(OtC_4H_9)_4$ | $Si(OC_4H_9)_4 Si(OCH_3)_4 Si(OC_2H_5)_4$ |
| Amid | $Hf(N(C_2H_5)_2)_4 Hf(N(CH_3)_2)_4$, $Hf(N(CH_3C_2H_5))_4$ | $Zr(N(C_2H_5)_2)_4 Zr(N_9CH_3)_2)_4$, $Zr(N(CH_3C_2H_5))_4$ | $Si(N(C_2H_5)_2)_4 Si(N(CH_3)_2)_4$, $Si(N(CH_3)_2)_3H$, $HfCl_2(hmds)_2$ |
| alkoxylamine | $Hf(dmae)_4$ | $Zr(dmae)_4$ | $Si(dmae)_4$ |
| ETC |  |  | $SiH_4$, $SiCl_4H_2$, $Si_2Cl_6$ |

*dmae(dimethylamine)

Alternatively, the metal silicate interface layer 12 may be formed using a metal organic chemical vapor deposition (MOCVD) technique or a reactive sputtering technique, if the MOCVD technique or the reactive sputtering technique provides the similar level of control as the ALD technique in terms of thickness or composition. The MOCVD technique can be performed using precursors such as $Hf(O-Si-R_3)_4$ or $Zr(O-Si-R_3)_4$, $R=C_2H_5$. Also, a Hf source such as Hf-t-butoxide, a Zr source such as Zr-t-butoxide, and a Si source such as tetraethoxyorthosilane or tetraethylorthosilicate (TEOS) can be used.

Next, as discussed above with reference to FIG. 1, the high-k dielectric layer 14 comprising metal alloy oxides are formed to overlie the silicate interface layer 12.

In further detail, according to one aspect, to form the high-k dielectric layer 14, a first layer 18 having a first metal element is formed by an ALD technique. Then, a second layer 20 is formed overlying the first layer 18 having a second metal element also by the ALD technique. The first and second metal elements may be a metal that can form oxides such as hafnium oxide, zirconium oxide, tantalum oxide, aluminum oxide, titanium oxide, yttrium oxide, strontium oxide, scandium oxide, lanthanum oxide, or barium oxide.

On the other hand, if the silicate interface layer 12 is formed of zirconium silicate, the overlying high-k dielectric layer 14 is preferably formed by alternately stacking the $ZrO_2$ layer and the $Al_2O_3$ layer plus a subsequent heat treatment, which will be described further below. In this case, because the metal of the silicate interface layer 12 is the same as one of the metals contained in the metal alloy oxide layer (high-k dielectric layer 14), the interface characteristics can be improved due to electrical coherency between the silicate interface layer 12 and the overlying high-k dielectric layer 14 as described above. Similarly, if the silicate interface layer 12 is formed of hafnium silicate, the high-k dielectric layer 14 is preferably formed by alternately stacking the $HfO_2$ layer and the $Al_2O_3$ layer plus a subsequent heat treatment, which will be described further below.

More preferably, the first layer 18 has a first predefined charge and the second layer 20 has a second predefined charge that is opposite to that of the first layer 18.

Most preferably, the first predefined charge is a positive fixed charge and the second predefined charge is a negative fixed charge. Along this line, the first layer 18 may be formed of hafnium oxide, zirconium oxide, tantalum oxide, aluminum oxide, titanium oxide, yttrium oxide, strontium oxide, scandium oxide, lanthanum oxide, or barium oxide; and the second layer 20 may be formed of aluminum oxide.

Therefore, according to one aspect of the present invention, it is possible to minimize the net fixed charge of the high-k dielectric layer 14. In this respect, in the prior art, there has been a problem with the fixed charge, which leads to coulomb scattering that reduces channel mobility.

However, with an aspect of the present invention, the prior art fixed-charge problem can be overcome by compensating the negative fixed charges in the second layer 20 formed of a material such as aluminum oxide with the positive fixed charges in the first layer 18 formed of a material such as hafnium oxide or zirconium oxide as discussed above, especially when the metal oxides are homogeneously mixed at an atomic level or interdiffused during a subsequent fabrication process.

The thickness of the second layer 20 may be approximately one half the thickness of the first layer 18. This is particularly true if the first layer 18 is formed of a material such as hafnium oxide or zirconium oxide and the second layer 20 is formed of an aluminum oxide because the amount of fixed charge in aluminum oxide is thought to be approximately two times more than that of hafnium oxide or zirconium oxide. For example, the first layer 18 may be formed to a thickness of approximately 10 angstroms and the second layer 20 may be formed to a thickness of approximately 5 angstroms.

The resulting structure is subsequently annealed or heat treated to form the multi-layer dielectric structure 15 shown in FIG. 1 according to an embodiment of the present invention. For example, the annealing temperature may be greater than approximately 900° C. such that the first layer 18 and the second layer 20 shown in FIG. 2 are combined or mixed to form the high-k dielectric layer 14 that includes at least two interdiffused metal elements. Preferably, the annealing temperature is approximately 950° C. More preferably, the annealing temperature is sufficiently high such that at least two metal elements are homogeneously mixed at an atomic level in the high-k dielectric layer 14 to form a metal alloy oxide layer.

Figure 3:
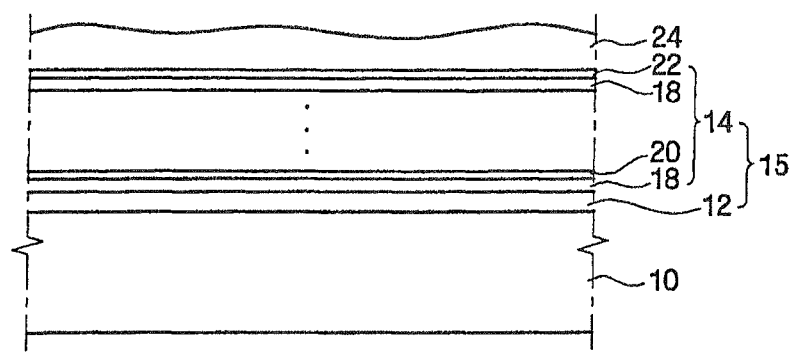
FIG. 3 is a cross-sectional view of a semiconductor device according to a further embodiment of the present invention.

Referring to FIG. 3, according to another aspect, before the heat treating or annealing to form the multi-layer dielectric structure 15 shown in FIG. 1, one or more additional first and second layers 18, 20 are formed on the resulting structure.

Another conductive layer 24 may be formed on the high-k dielectric layer 14 to form various semiconductor devices. Also, before annealing, the uppermost layer 22 may comprise aluminum oxide to improve the interface characteristics between the high-k dielectric layer 14 and the conductive layer 24.

In another embodiment, the high-k dielectric layer 14 may be formed by a MOCVD technique. Preferably, sources for the two metal elements are simultaneously supplied to form the high-k dielectric layer 14 comprising metal alloy oxides. In the alternative, the metal alloy oxide layer may be formed using a reactive sputtering technique. The reactive sputtering technique is performed by injecting an oxygen gas into the process chamber during the deposition of the metals.

The present invention described above can be used in the formation of a MOS transistor as described below. Also, the present invention is equally applicable to any dielectric for semiconductor devices, such as an inter-gate dielectric layer of non-volatile memory devices, or a dielectric layer of a storage capacitor, all of which are within the spirit and scope of the present invention.

Figure 4:
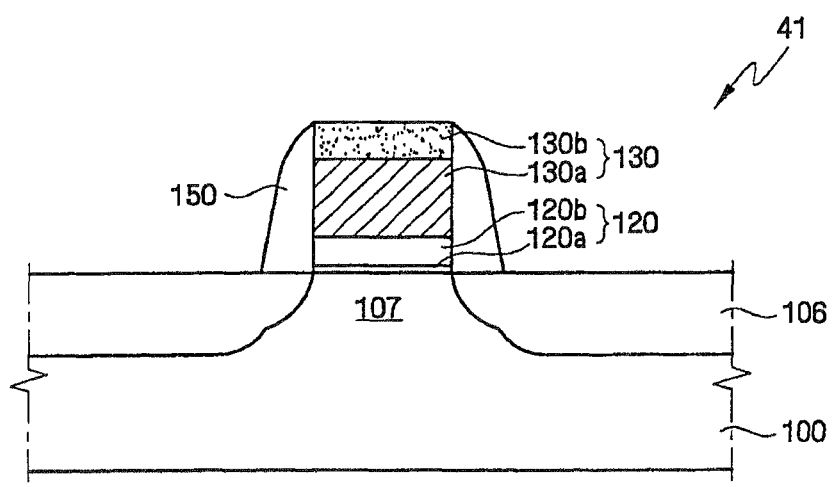
FIG. 4 illustrates an embodiment of the present invention utilized in a MOS transistor.

In particular, referring to FIG. 4, a MOS transistor 41 comprises a semiconductor substrate 100, a silicate interface layer 120a formed over the substrate 100, and a high-k dielectric layer 120b formed over the silicate interface layer 120a to form a gate dielectric layer 120. The silicate interface layer 120a and the high-k dielectric layer 120b are each formed of a dielectric material as discussed in connection with FIG. 1. Further, the MOS transistor 41 may further include a gate electrode 130 comprised of, for example, a polysilicon layer 130a, a silicide layer 130b, and a source/drain region formed adjacent the gate electrode 130. The gate electrode 130 may be formed of a metal. Optionally, a spacer 150 may be formed along opposite sides of the gate electrode 130 to complete the semiconductor device 41, which has a channel region 107.

Figure 5:
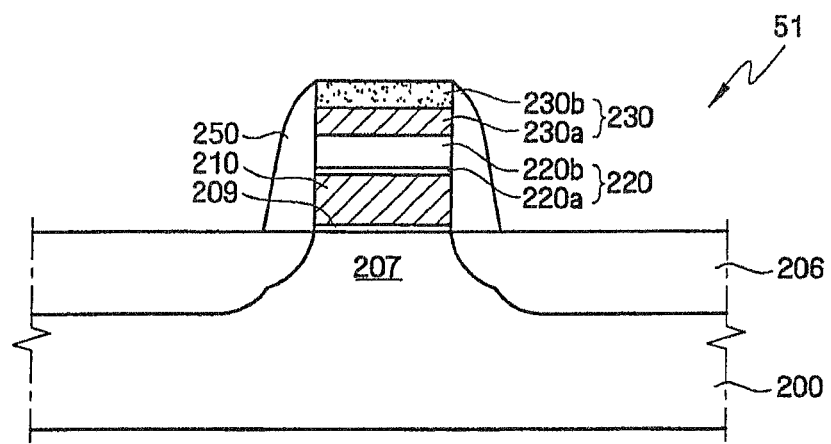
FIG. 5 illustrates an embodiment of the present invention utilized in a non-volatile memory device.

Referring to FIG. 5, according to another embodiment, a non-volatile memory device 51 comprises a semiconductor substrate 200, a floating gate 210 having a gate insulating layer 209 overlying the substrate 200, a silicate interface layer 220a formed over the floating gate 210, and a high-k dielectric layer 220b formed over the silicate interface layer 220a to form an intergate dielectric layer 220. The silicate interface layer 220a and the high-k dielectric layer 220b are each formed of a dielectric material as discussed in connection with FIG. 1. Also, a control gate 230 overlies the intergate dielectric layer 220. The control gate 230 may be comprised of a polysilicon layer 230a and a silicide layer 230b, as is known in the art. Other convention structures such as a spacer 250 and a source/drain region 206 may be additionally formed to complete the non-volatile memory device 51 which has a channel region 207. In this embodiment, the multi-layer dielectric structure discussed in connection with FIG. 1 can be applied only to the intergate dielectric layer 220 or the gate insulation layer 209. Alternatively, the multi-layer dielectric structure can be applied to both the intergate dielectric layer 220 and the gate insulation layer 209.

Figure 6:
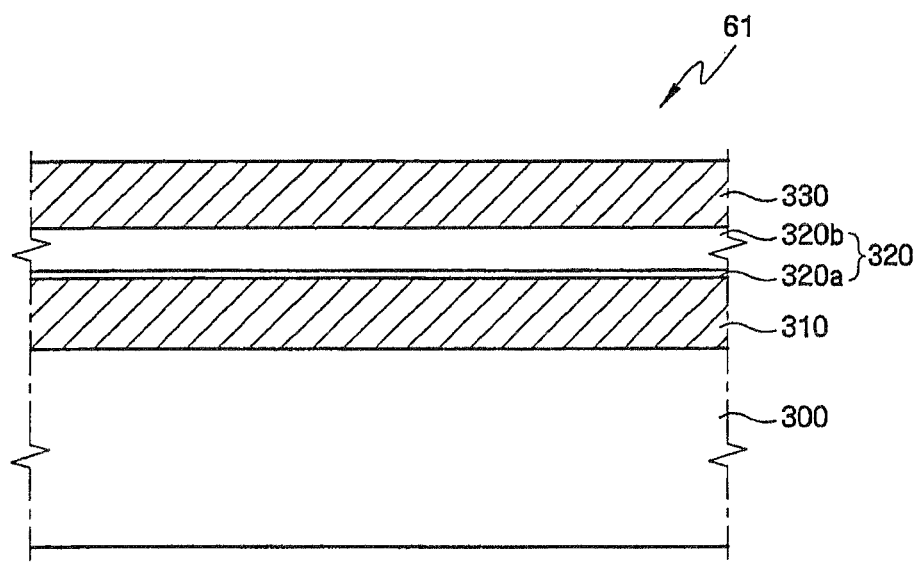
FIG. 6 illustrates an embodiment of the present invention utilized in a capacitor.

Referring to FIG. 6, according to still another embodiment, a capacitor 61 comprises a lower electrode 310, a silicate interface layer 320a formed over the lower electrode 310, and a high-k dielectric layer 320b formed over the silicate interface layer 320a to form a capacitor dielectric layer 320. The silicate interface layer 320a and the high-k dielectric layer 320b are formed of a dielectric material as discussed in connection with FIG. 1. The capacitor 61 additionally includes an upper electrode 330 overlying the capacitor dielectric layer 320. The capacitor 61 is electrically connected to a semiconductor substrate 300.

It is to be noted that the substrate 10 shown in FIGS. 1 through 6 can be a semiconductor or a conductor, such as doped polysilicon, within the spirit and scope of the present invention. Also, the substrate 10 can also be a single crystalline silicon substrate or silicon on insulator (SOI) substrate.

Figure 7:
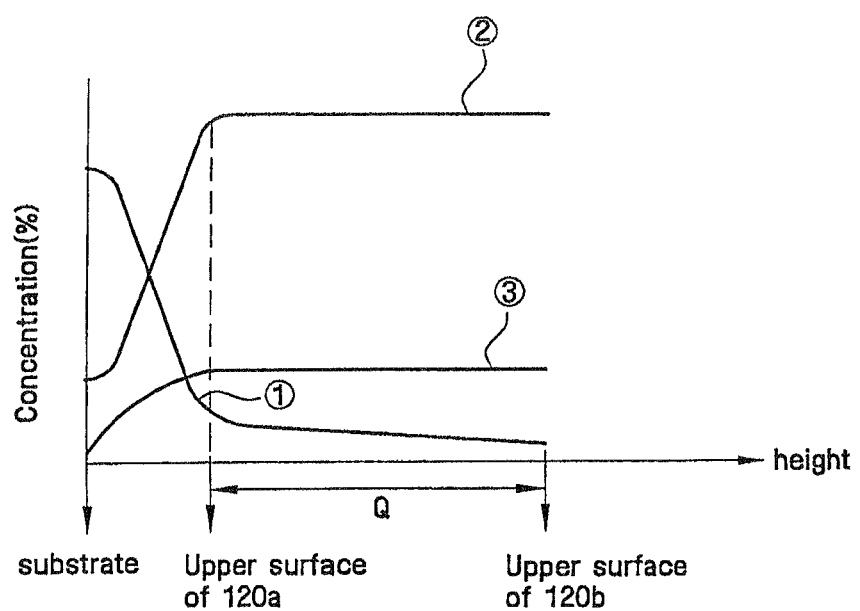
FIG. 7 is a graph illustrating the structural analysis for a structure formed using an embodiment discussed with reference to FIG. 4.

FIG. 7 is a graph illustrating the structural analysis for a structure formed using an embodiment discussed with reference to FIG. 4, in which the silicate interface layer 120a may be HfSiO$_2$ and the high-k dielectric layer may have a formula of Hf$_{0.67}$Al$_{0.23}$O$_{1.67}$.

Referring to FIG. 7, symbol ① indicates the concentration of Si, symbol ② indicates the concentration of Hf, and symbol ③ indicates the concentration of aluminum. Preferably, Hf and Al both have a uniform concentration throughout the high-k dielectric layer 120b. The silicate interface layer 120a may include aluminum atoms diffused from the high-k dielectric layer 120b and the high-k dielectric layer 120b may include silicon atoms diffused from the silicate interface layer 120a.

Further, in the silicate interface layer 120a, the concentration of Al is decreased from the upper surface of the silicate interface layer 120a towards the substrate 100 and the concentration of Si is decreased from the upper surface of the silicate interface layer 120a towards the upper surface of the high-k dielectric layer 120b.

In the alternative, the value of y in the high-k dielectric layer 120b represented by a formula of A$_y$B$_{1-y}$O$_z$ may be decreased from the interface between the silicate interface layer 120a and the bottom surface of the high-k dielectric layer 120b towards the upper surface of the high-k dielectric layer 120b. The concentration of A has a gradient along the thickness of the high-k dielectric layer 120b. Also, the concentration of B may be inversely proportional to the concentration of A within the high-k dielectric layer 120b. In other words, the value of y can be varied depending on the height of the gate dielectric layer 120. This is particularly true if A is the same as the metal M of the silicate interface layer 120a, and B comprises a material chemically stable with the overlying electrode structure such as a gate electrode, control gate, or capacitor upper electrode. Consequently, reliable semiconductor device structures can be formed with such embodiments of the present invention.

According to another aspect of the present invention, the concentration of ② and ③ in section Q can be stepped or vary by some function depending on the height of the gate dielectric layer 120.

In conclusion, with the embodiments of the present invention, interface characteristics can be improved and the EOT can be maintained or reduced in contrast with the prior art dielectric layer structure such as one incorporating silicon nitride or oxynitride interface layers, or a silicate bulk layer without an interface layer. In other words, by combining the silicate interface layer 12 of which dielectric constant is preferably greater than any one of silicon oxide, silicon nitride or oxynitride along with a high-k dielectric layer 14, a low EOT with improved interface characteristics can be achieved.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method of forming a multi-layer structure for a semiconductor device the method comprising:

forming an interface layer on a semiconductor substrate;

forming a first high-k dielectric layer comprising a first metal element on the interface layer;

forming a second high-k dielectric layer comprising at least one of aluminum and lanthanum on the first high-k dielectric layer; and annealing the first high-k dielectric layer and the second high-k dielectric layer such that the first metal element and the one of aluminum or lanthanum are mixed to form a combined high-k dielectric layer, wherein the combined high-k dielectric layer is represented by a formula of $A_yB_{1-y}O_z$, wherein $0<y<1$ and the value of y is decreased from an interface between the interface layer and a bottom surface of the combined high-k dielectric layer towards an upper surface of the combined high-k dielectric layer, wherein A is a group IV metal and B is a group XIII metal.

2. The method of claim 1, wherein the interface layer comprises silicate.

3. The method of claim 2, wherein the silicate comprises metal silicate.

4. The method of claim 3, wherein a metal in the silicate and a metal in the combined high-k dielectric layer are from the same periodic group.

5. The method of claim 1, wherein the first metal element comprises at least one of hafnium and zirconium.

6. The method of claim 1, wherein the combined high-k dielectric layer comprises at least one of hafnium-aluminum alloy oxide and hafnium-lanthanum alloy oxide.

7. The method of claim 1, wherein the first and second high-k dielectric layers are respectively formed by ALD.

8. The method of claim 1, wherein the annealing is performed at a temperature being greater than approximately 900 degrees in Celsius.

9. The method of claim 1, wherein the interface layer is represented by a formula $M_{1-x}Si_xO_2$, wherein $1-x$ is approximately 0.1-0.5, M is a group IV metal.

10. A method of forming a multi-layer structure for a semiconductor device, the method comprising:

forming an interface layer on a semiconductor substrate;

forming a first high-k dielectric layer comprising hafnium on the interface layer;

forming a second high-k dielectric layer comprising at least one of aluminum and lanthanum on the first high-k dielectric layer; and annealing the first high-k dielectric layer and the second high-k dielectric layer such that the hafnium in the first high-k dielectric layer and at least one of aluminum and lanthanum in the second high-k dielectric layer are mixed to form a combined high-k dielectric layer, wherein the combined high-k dielectric layer is represented by a formula of $A_yB_{1-y}O_z$, wherein $0<y<1$ and the value of y is decreased from an interface between the interface layer and a bottom surface of the combined high-k dielectric layer towards an upper surface of the combined high-k dielectric layer, wherein A is a group IV metal and B is a group XIII metal.

11. A method of forming a multi-layer structure for a semiconductor device, the method comprising:

forming an Si and oxygen containing interface layer on a semiconductor substrate;

forming a first high-k dielectric layer comprising a metal element on the interface layer by ALD;

forming a second high-k dielectric layer comprising at least one of aluminum and lanthanum on the first high-k dielectric layer by ALD; and annealing the first high-k dielectric layer and the second high-k dielectric layer such that the one of aluminum or lanthanum diffuses into the first high-k dielectric layer to form a combined high-k dielectric layer, wherein the combined high-k dielectric layer is represented by a formula of $A_yB_{1-y}O_z$, wherein $0<y<1$ and the value of y is decreased from an interface between the interface layer and a bottom surface of the combined high-k dielectric layer towards an upper surface of the combined high-k dielectric layer, wherein A is a group IV metal and B is a group XIII metal.

12. The method of claim 11, wherein the metal element comprises hafnium or zirconium.

* * * * *